United States Patent
Endo et al.

(10) Patent No.: US 9,287,653 B2
(45) Date of Patent: Mar. 15, 2016

(54) CASING FOR ELECTRIC CONNECTOR COUPLED TO A CABLE

(71) Applicant: DAI-ICHI SEIKO CO., LTD., Kyoto (JP)

(72) Inventors: Takayoshi Endo, Shizuoka (JP); Sakai Yagi, Shizuoka (JP); Shogo Jinnouchi, Fukuoka (JP); Hisashi Hamachi, Fukuoka (JP)

(73) Assignee: DAI-ICHI SEIKO CO., LTD. (JP)

( * ) Notice: Subject to any disclaimer, the term of this patent is extended or adjusted under 35 U.S.C. 154(b) by 0 days.

(21) Appl. No.: 14/558,258

(22) Filed: Dec. 2, 2014

(65) Prior Publication Data

US 2015/0180156 A1     Jun. 25, 2015

(30) Foreign Application Priority Data

Dec. 20, 2013  (JP) ................. 2013-264075
Dec. 20, 2013  (JP) ................. 2013-264180
Jan. 14, 2014  (JP) ................. 2014-004432

(51) Int. Cl.
| | |
|---|---|
| *H01R 12/00* | (2006.01) |
| *H01R 13/516* | (2006.01) |
| *H01R 13/60* | (2006.01) |
| *H01R 13/52* | (2006.01) |
| *H05K 5/00* | (2006.01) |

(52) U.S. Cl.
CPC .......... *H01R 13/516* (2013.01); *H01R 13/5202* (2013.01); *H01R 13/60* (2013.01); *H05K 5/0069* (2013.01); *Y10T 29/49826* (2015.01)

(58) Field of Classification Search
CPC ............. H01R 13/6658; H01R 23/025; H01R 23/7068; H01R 31/06
USPC .......................... 439/76.1, 559; 361/736, 752
See application file for complete search history.

(56) References Cited

U.S. PATENT DOCUMENTS

| | | | |
|---|---|---|---|
| 4,611,872 A | 9/1986 | Ito | 439/277 |
| 4,676,575 A | 6/1987 | Denlinger | 439/271 |
| 4,917,620 A | 4/1990 | Samejima | 439/271 |
| 5,173,061 A | 12/1992 | Comerci et al. | 439/536 |

(Continued)

FOREIGN PATENT DOCUMENTS

| | | | | |
|---|---|---|---|---|
| JP | 06045032 | 2/1994 | | H01R 13/74 |
| JP | 3049174 | 6/1998 | | H01R 13/74 |

(Continued)

OTHER PUBLICATIONS

Office Action issued in U.S. Appl. No. 14/558,292, dated Oct. 26, 2015 (18 pgs).

(Continued)

*Primary Examiner* — Phuong Dinh

(74) *Attorney, Agent, or Firm* — Hayes Soloway P.C.

(57) ABSTRACT

A casing in which an electric connector is housed, including a floor, and a wall standing perpendicular to the floor, the wall being formed with an opening, when a part of the electric connector projects outwardly through the opening, a seal formed around the part making close contact with an inner edge of the opening, the casing further including a first positioning unit for positioning the electric connector relative to the opening in a first direction defined as a length-wise direction of the wall, and a second positioning unit for positioning the electric connector relative to the opening in a height-wise direction of the wall.

15 Claims, 15 Drawing Sheets

(56) References Cited

U.S. PATENT DOCUMENTS

| | | | | |
|---|---|---|---|---|
| 5,362,243 A * | 11/1994 | Huss | H01R 13/719 | 361/749 |
| 5,389,005 A | 2/1995 | Kodama | | 439/272 |
| 5,857,863 A * | 1/1999 | Onizuka | B60K 37/02 | 439/248 |
| 6,547,576 B2 * | 4/2003 | Peng | H01R 13/506 | 439/173 |
| 7,066,751 B2 * | 6/2006 | Chen | H01R 13/2442 | 439/247 |
| 7,530,818 B1 * | 5/2009 | Wang | H01R 31/065 | 439/638 |
| 8,066,518 B2 | 11/2011 | Homme et al. | | 439/78 |
| 8,162,676 B1 | 4/2012 | Hsieh et al. | | 439/76.1 |
| 8,734,172 B2 * | 5/2014 | Takei | H01R 13/6315 | 439/248 |
| 8,734,174 B2 | 5/2014 | Nakamura | | 439/271 |
| 8,770,989 B2 * | 7/2014 | Ohhashi | H01R 13/5202 | 439/589 |
| 8,773,860 B2 * | 7/2014 | Wang | H05K 7/1487 | 361/725 |
| 8,942,001 B2 * | 1/2015 | Kawai | H05K 5/0052 | 174/50.5 |
| 8,992,249 B2 * | 3/2015 | Kobayashi | H01R 13/6591 | 439/362 |
| 2011/0111610 A1 | 5/2011 | Kim et al. | | 439/157 |
| 2011/0300731 A1 | 12/2011 | Nakamura | | 439/271 |
| 2015/0155651 A1 | 6/2015 | Ejiri | | H01R 13/5213 |
| 2015/0180159 A1 | 6/2015 | Endo et al. | | H01R 13/5202 |

FOREIGN PATENT DOCUMENTS

| | | | | |
|---|---|---|---|---|
| JP | 2001345153 | 12/2001 | | H01R 13/74 |
| JP | 2007280795 | 10/2007 | | H01R 13/74 |
| JP | 2009009845 | 1/2009 | | H01R 13/52 |

OTHER PUBLICATIONS

Office Action issued in U.S. Appl. No. 14/558,294, dated Oct. 30, 2015 (14 pgs).

* cited by examiner

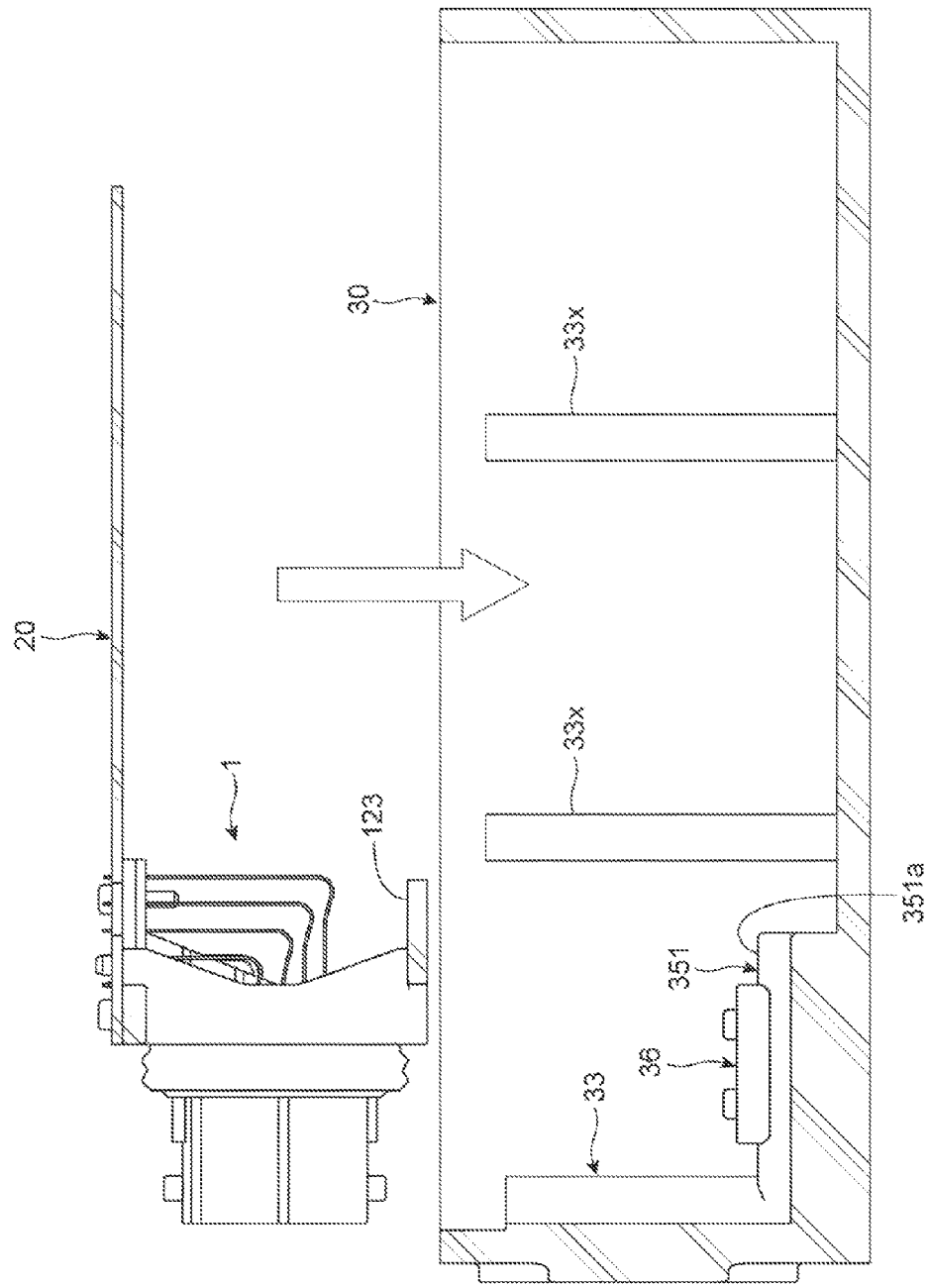

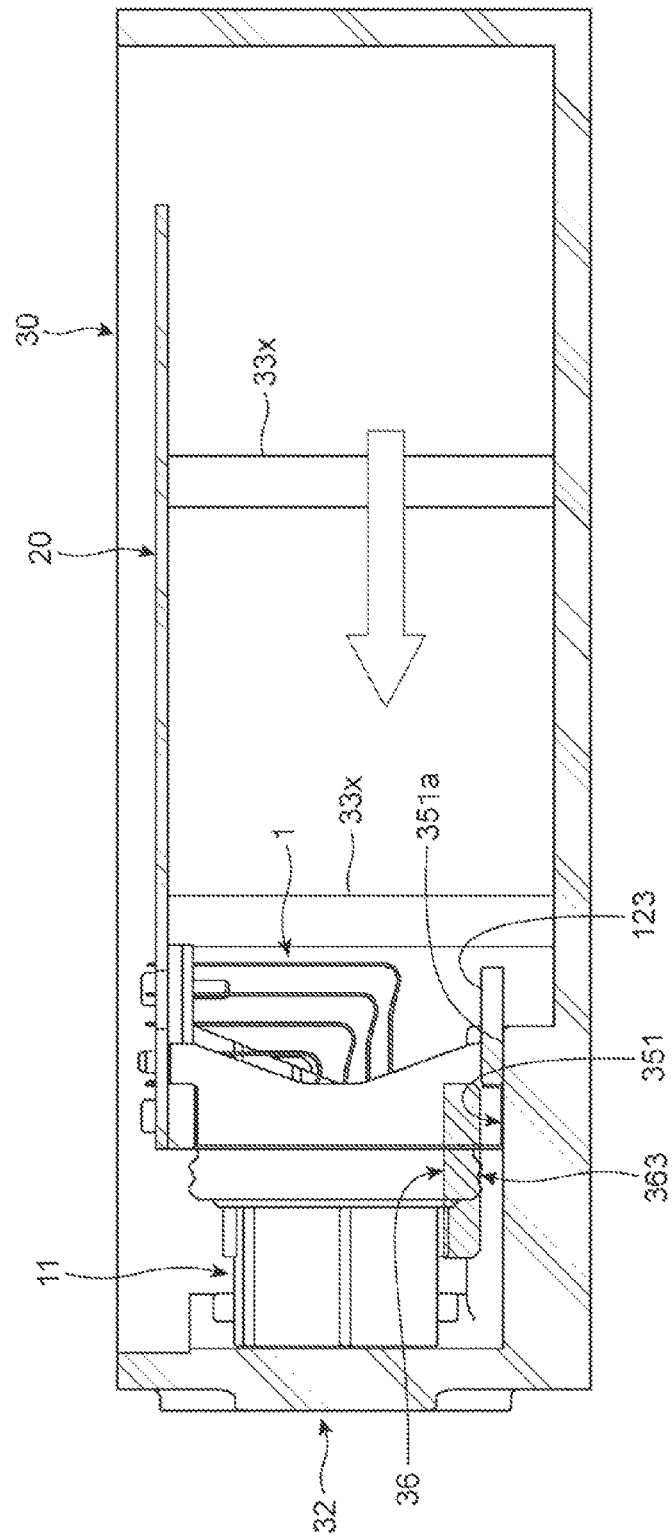

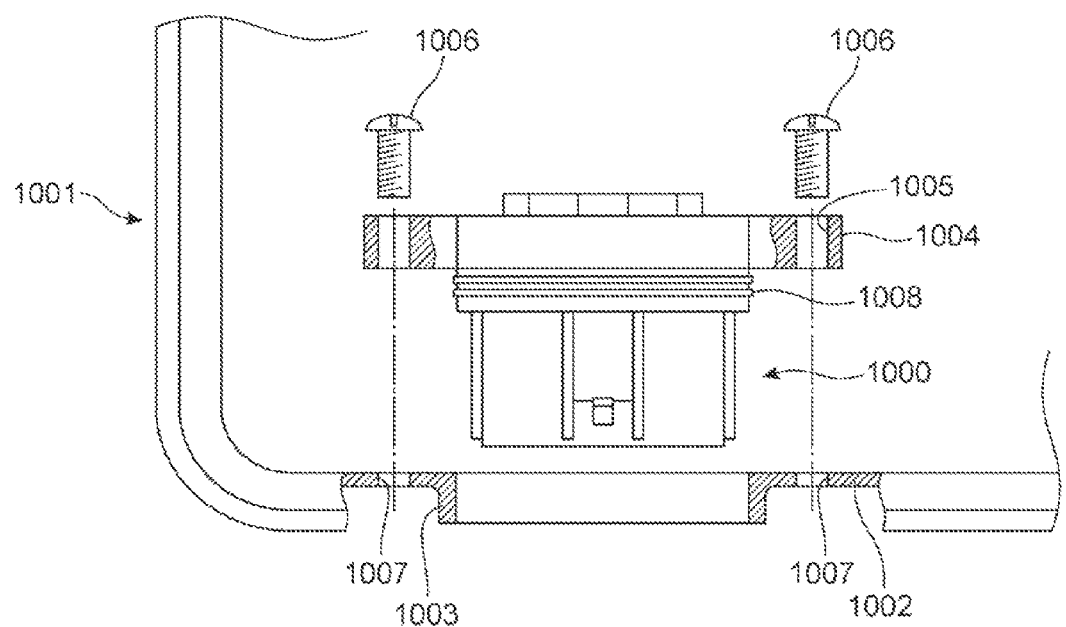

CASING FOR ELECTRIC CONNECTOR COUPLED TO A CABLE

BACKGROUND OF THE INVENTION

1. Field of the Invention

The invention relates to a casing used for an electric connector, and further to an electric connector to be used in combination with the casing.

2. Description of the Related Art

A kind of an electric connector is housed in a casing, and is coupled with a second electric connector connected to a cable. The electric connector includes a fitting portion through which the electric connector is coupled with the second electric connector. The fitting portion generally extends outwardly through an opening formed with the casing. Accordingly, the electric connector, in particular an electric connector to be equipped in an automobile, is generally designed to include a seal making close contact with the opening for the purpose of waterproofness.

An electric connector as mentioned above is suggested in Japanese Patent Application Publication No. 2001-345153.

FIG. 13 is a cross-sectional view of the electric connector suggested in the Publication.

An electric connector 1000 is inserted into a cylindrical portion 1003 formed at a sidewall 1002 of a casing 1001 until a flange 1004 of the electric connector 1000 makes abutment with the sidewall 1002. Then, screws 1006 are screwed into threaded holes 1007 through fixing holes 1005 to thereby fix the electric connector 1000 to the casing 1001. A seal 1008 is compressed by and accordingly makes close contact with an inner surface of the cylindrical portion 1003.

In the conventional electric connector 1000 illustrated in FIG. 13, the seal 1008 is compressed by and accordingly is able to make close contact with an inner surface of the cylindrical portion 1003. Consequently, even if the electric connector 1000 were coupled to the cylindrical portion 1003 having an axis extending in parallel with an axis of the electric connector, the electric connector 1000 does not exert an influence on a degree by which the seal 1008 is compressed in a direction perpendicular to the axis of the electric connector 1000, ensuring that the seal 1008 is entirely uniformly compressed, and thus, the seal 1008 provides sufficient sealing performance.

However, if the electric connector 1000 were fixed to the casing 1001 in such a condition that the electric connector 1000 inclines relative to the cylindrical portion 1003, the seal 1008 cannot be uniformly compressed due to the inaccuracy in a positional relation between the electric connector 1000 and the casing 1001, resulting in that it is likely that water penetrates the electric connector 1000 through an insufficiently compressed portion of the seal 1008.

SUMMARY OF THE INVENTION

In view of the above-mentioned problem in the conventional electric connector, it is an object of the present invention to provide a casing used for an electric connector, capable of preventing the electric connector from deviating in position from an opening of the casing into which the electric connector is to be fit, to thereby ensure uniform sealing performance brought by a seal.

It is further an object of the present invention to provide an electric connector to be used in combination with the above-mentioned casing.

In one aspect of the present invention, there is provided a casing in which an electric connector is housed, including a floor, and at least one wall standing perpendicularly to the floor, wherein the wall is formed with an opening, when a part of the electric connector projects outwardly through the opening, a seal formed around the part makes close contact with an inner edge of the opening, the casing further including a first positioning unit for positioning the electric connector relative to the opening in a first direction defined as a length-wise direction of the wall, and a second positioning unit for positioning the electric connector relative to the opening in a height-wise direction of the wall.

In the casing in accordance with the present invention, the first positioning unit positions the electric connector relative to the opening in a first direction defined as a length-wise direction of the wall, and the second positioning unit positions the electric connector relative to the opening in a height-wise direction of the wall.

The first positioning unit may be designed to include a single pillar situated outwardly of the opening in the first direction, the pillar being located such that when the electric connector is arranged in contact with the pillar, the part of the electric connector is located in alignment with the opening.

It is possible to position the electric connector relative to the opening in the first direction merely by bringing the electric connector into a contact with the pillar.

The first positioning unit may be designed to include a pair of pillars each situated outwardly of the opening in the first direction, a distance between the pillars being determined in accordance with a length of the electric connector in the first direction.

It is possible to position the electric connector relative to the opening in the first direction merely by inserting the electric connector into a space formed between the pillars.

It is preferable that the second positioning unit includes a first unit having a first surface with which the electric connector makes contact at a lower surface thereof.

It is preferable that the second positioning unit includes a second unit having a second surface with which the electric connector makes contact at an upper surface thereof.

It is preferable that the second surface is located on a level with a top surface of the pillar, the second unit being mounted on the top surface of the pillar.

The pillar can be used for attaching the second unit thereto. Accordingly, it is not necessary to prepare a particular part to which the second unit is attached or fixed.

It is preferable that the casing further includes a pair of guide paths allowing the electric connector at opposite ends thereof located in the first direction to slide towards the opening from inside of the casing on a first surface with which the electric connector makes contact at a lower surface thereof.

It is preferable that each of the guide paths includes a first part having the first surface, and a second part having a third surface standing perpendicularly to the first surface, a distance between the third surfaces of the guide paths being in accordance with a length of the electric connector in the first direction.

It is preferable that each of the third surfaces includes a tapered portion causing a distance between the third surfaces to be smaller towards the opening from inside of the casing.

It is preferable that each of the guide paths further includes a third part having a second surface extending from the third surface in parallel with the first surface, a distance between the first and second surfaces being such a distance that the electric connector is fitable at the opposite ends into a space formed between the first and second surfaces.

It is preferable that the third part is detachably attached to the second part.

It is preferable that a length of the second surface in a second direction perpendicular to the first direction is smaller than a length of the first surface in the second direction.

It is preferable that the second surface extends towards the opening from a location away in the second direction from an end of the first surface located remoter than the other end thereof from the opening in the second direction.

In another aspect of the present invention, there is provide an electric connector to be housed in the above-mentioned casing, including a pair of surfaces at opposite ends thereof located in the first direction, each of the surfaces making contact with an inner surface of each of the pillars.

In still another aspect of the present invention, there is provided an electric connector to be housed in the casing defined in claim 9, including a pair of extensions outwardly extending from opposite ends located in the first direction, each of the extensions having a tapered portion causing a distance between the extensions to be smaller towards the opening from inside of the casing.

The advantages obtained by the aforementioned present invention will be described hereinbelow.

In the casing in accordance with the present invention, the first positioning unit positions an electric connector relative to the opening in a first direction defined as a length-wise direction of the wall, and the second positioning unit positions the electric connector relative to the opening in a height-wise direction of the wall. Thus, it is possible to prevent the electric connector from deviating in position from the opening of the casing into which the electric connector is to be fit, to thereby ensure uniform sealing performance provided by a seal.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 11A is a cross-sectional view showing a first step of housing the electric connector in the casing.

FIG. 11B is a cross-sectional view showing a second step of housing the electric connector in the casing.

FIG. 13 is a partial cross-sectional view of the conventional electric connector and casing.

DESCRIPTION OF THE PREFERRED EMBODIMENTS

The preferred embodiment in accordance with the present invention is explained hereinbelow with reference to drawings. In the specification, a "front" of the electric connector indicates a side of the electric connector through which the electric connector is connected to the second electric connector, a "rear" of the electric connector indicates a side opposite to a "front", a "lower" indicates a direction from the electric connector to a floor of the casing, and an "upper" indicates a direction opposite to a "lower".

As illustrated in FIGS. 1 to 4, an electric connector 1 is mounted on a printed circuit board 20, housed in a casing 30, and then, connected to a second electric connector 100 to which a cable C is connected. The casing 30 is in the form of a box (a cover thereof is not illustrated).

Figure 4:
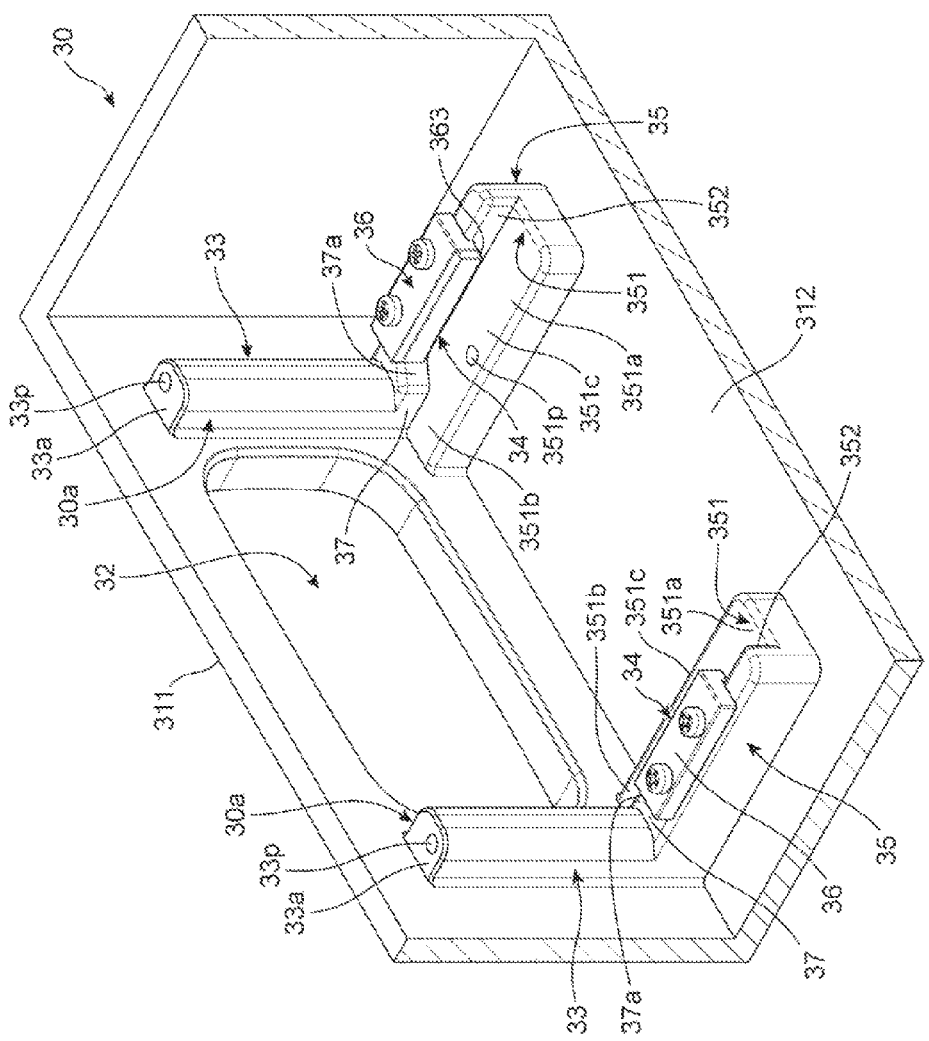
FIG. 4 is a partial rear perspective view of the casing.

As illustrated in FIG. 4, the casing 30 includes at least a floor 312, and a front wall 311 standing at a front edge of the floor 312 perpendicularly to the floor 312. The front wall 311 is formed with a rounded cornered rectangular opening 32.

Figure 8:
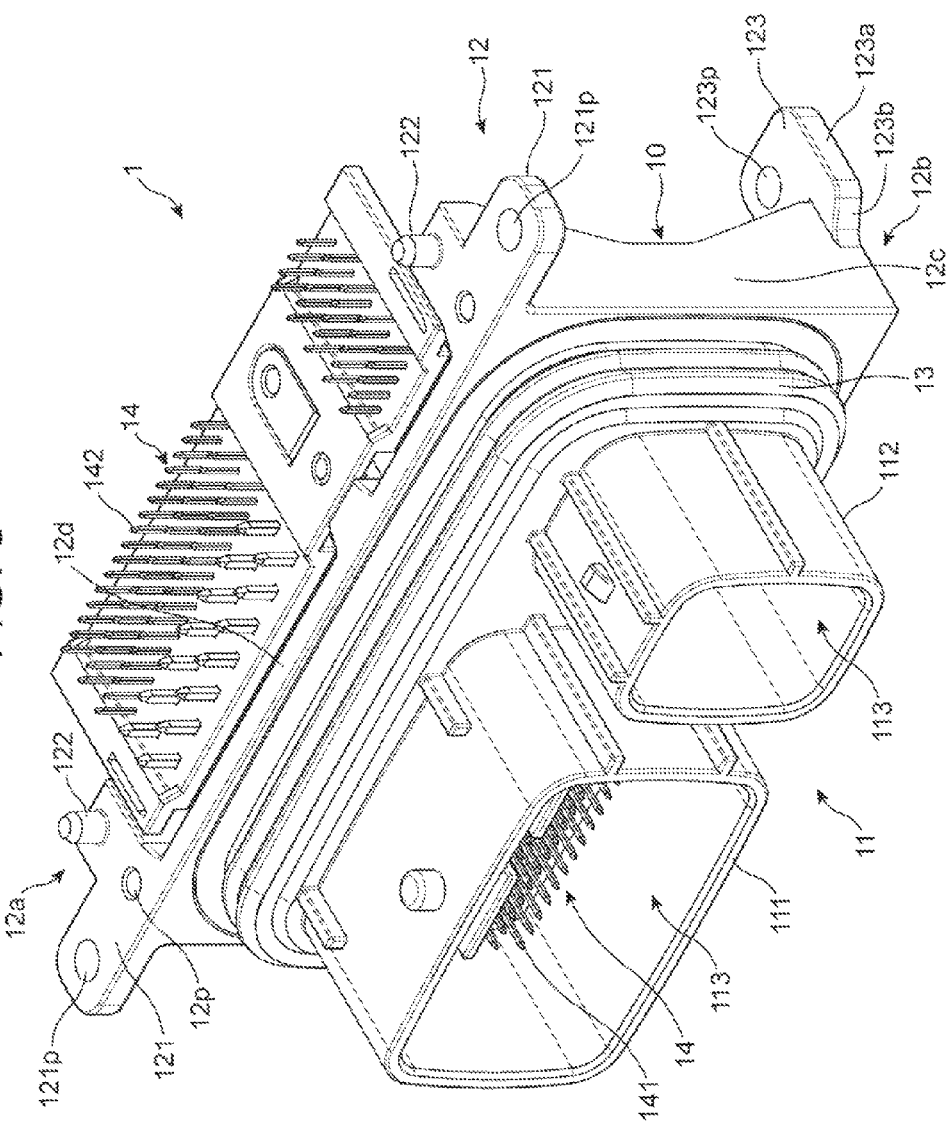
FIG. 8 is a front upper perspective view of the electric connector.
Figure 9:
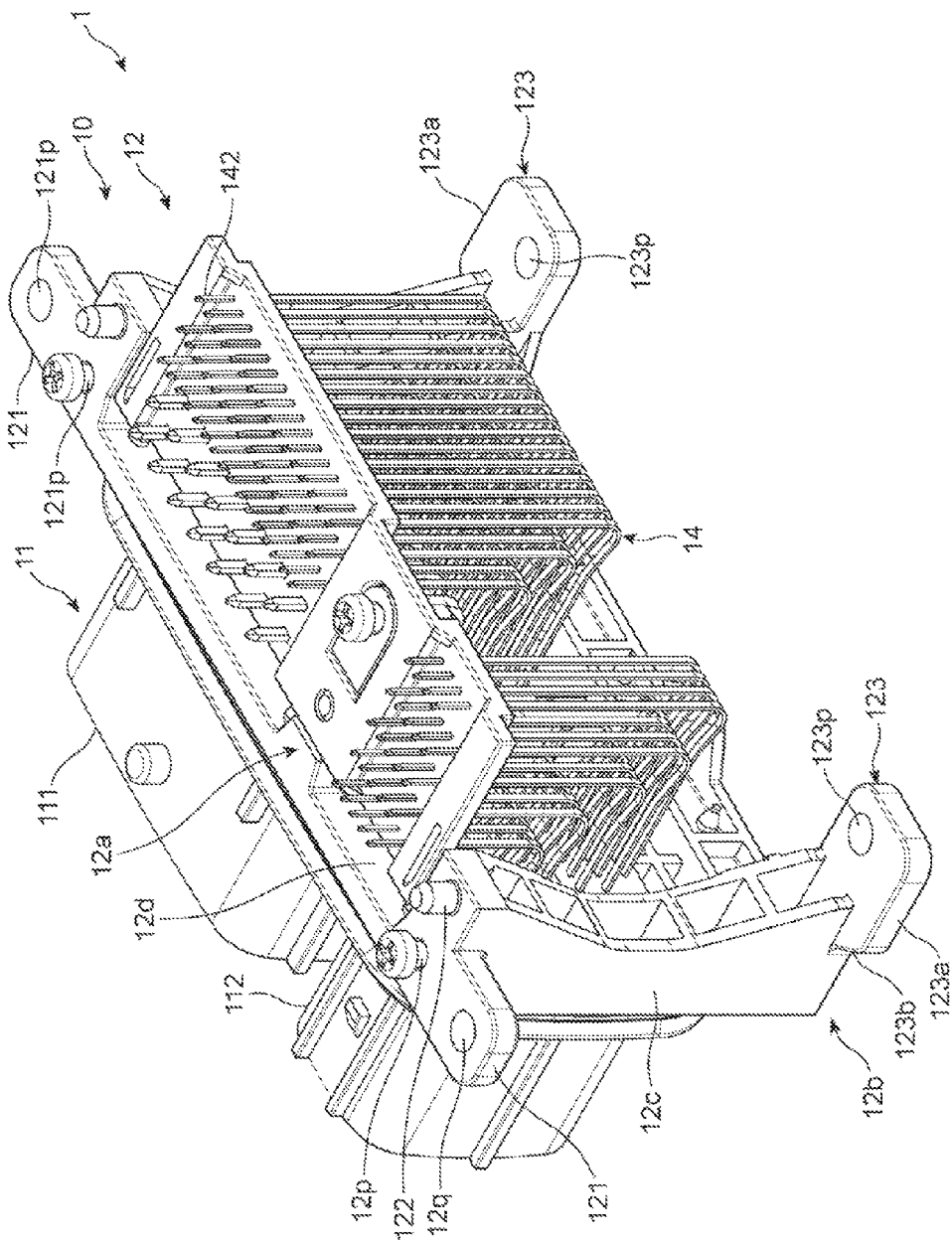
FIG. 9 is a rear lower perspective view of the electric connector.
Figure 10:
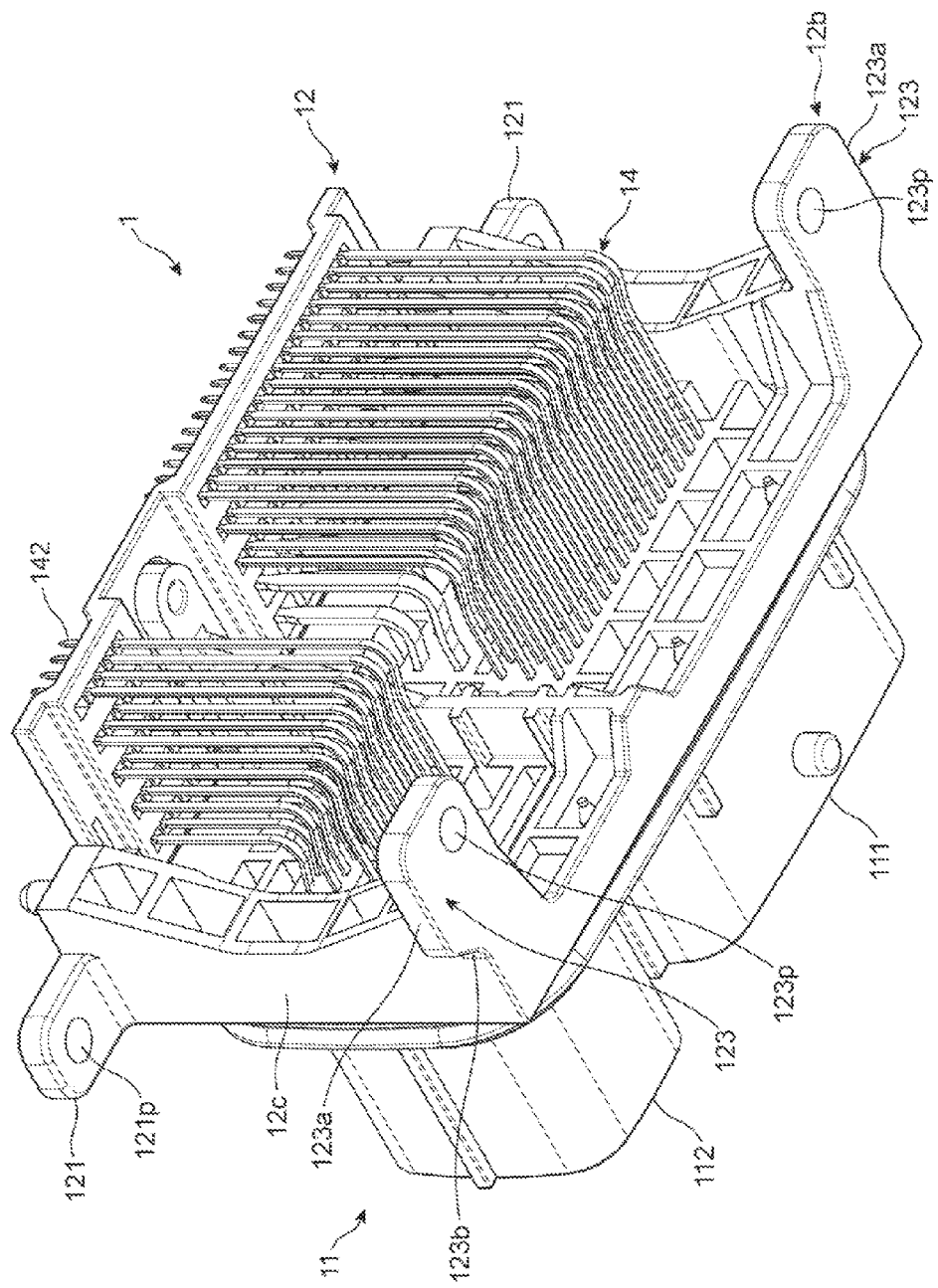
FIG. 10 is a rear lower perspective view of the electric connector.

As illustrated in FIGS. 8 to 10, the electric connector 1 includes a fitting portion 11 (defined as "a part" in claim 1) through which the electric connector 1 is connected to the second electric connector 100 (see FIG. 1), a body 12, a seal 13 arranged around the fitting portion 11 for providing waterproofness, and a plurality of male connector terminals 14 making mechanical and electrical contact with female connector terminals of the second electric connector 100. The fitting portion 11 is formed at a front of the body 12. The fitting portion 11 and the body 12 are formed integral with each other by a resin molding process.

The fitting portion 11 comprises a first fitting portion 111 and a second fitting portion 112 both arranged in a width-wise direction F1 of the casing 30 (that is, a length-wise direction of the front wall 311). Both of the first and second fitting portions 111 and 112 have a hollow inner space 113. The first fitting portion 111 is designed to have a larger cross-sectional area than that of the second fitting portion 112. Each of the first and second fitting portions 111 and 112 is fit into the second electric connector 100. The male connector terminals 14 extend in the inner spaces 113.

The male connector terminals 14 pass through the body 12 to thereby be fixed relative to the body 12. The body 12 is fixed to the casing 30 to thereby fix the electric connector 1 to the casing 30.

The body 12 includes a top plate 12a located highest in the body 12. The top plate 12a is formed at opposite ends thereof with threaded holes 12p into which screws are screwed for fixing the printed circuit board 20 onto the electric connector 1.

The top plate 12a includes extensions 121 extending from opposite ends of the top plate 12a in the width-wise direction F1. The extensions 121 are designed to have a flat surface, and to be formed with fixing holes 121p. The top plate 12a is formed further with a pair of projections 122 at opposite ends thereof for positioning the printed circuit board 20 relative to the electric connector 1.

The body 12 is formed at opposite ends of a bottom 12b thereof with a pair of extensions 123 extending in the width-wise direction F1 and further rearwardly (that is, a direction F2 (see FIGS. 1 and 3) perpendicular to the direction F1). Each of the extensions 123 is formed with a fixing hole 123p.

Each of the extensions 123 includes a sidewall 123a extending in the direction F2 in which the electric connector 1 is connected to the second electric connector 100, and a front wall 123b designed to be tapered in the direction F2 from a rear towards a front of the body 12. Thus, each of the extensions 123 is substantially trapezoidal.

The body 12 includes a pair of side structures 12c comprising two resin vertical plates spaced away from each other in parallel with each other, and a plurality of horizontal partition plates sandwiched between the vertical plates and equally spaced away from one another. The side structures 12c form a part of the body 12 together with a front wall 12d supporting male connector terminals 14 therewith.

The seal 13 is formed on the front wall 12d to surround therewith the fitting portion 11 at a proximal end of the fitting portion 11. The seal 13 comprises a lip packing, and makes close contact with an inner edge 32a of the opening 32.

Figure 7:
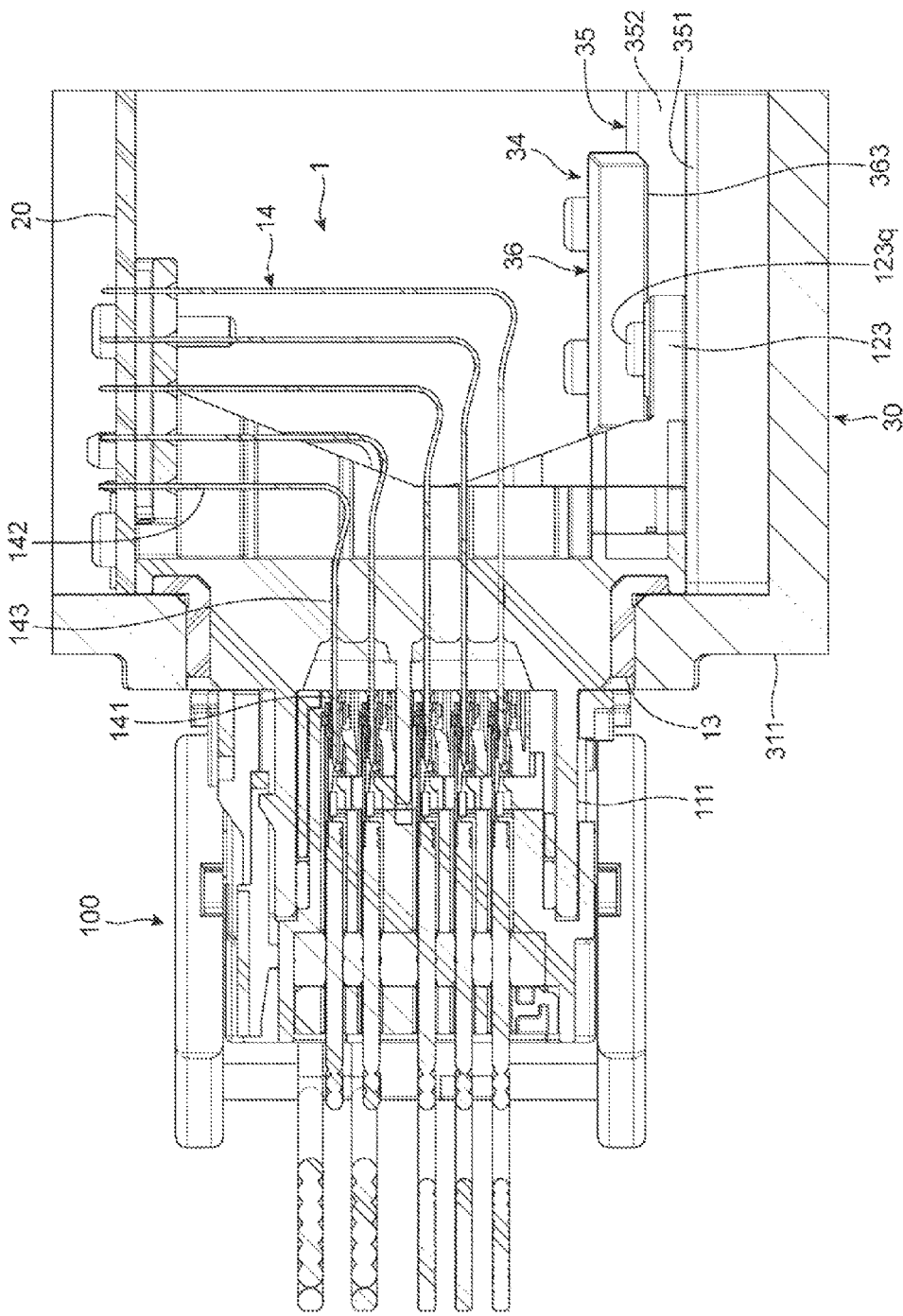
FIG. 7 is a cross-sectional view of the casing in which the electric connector connected to the second electric connector is housed.

As illustrated in FIG. 7, each of the male connector terminals 14 includes a first portion 141 linearly extending forwardly from the body 12 into the first and second fitting portions 111 and 112, the first portion 141 being in the form of a pin, a second portion 142 extending rearwardly from the body 12 towards the printed circuit board 20, the second portion 142 being L-shaped, and a third portion 143 passing through the body 12.

The first portion 141 is inserted into and makes electrical contact with a female connector terminal of the second electric connector 100 fit into the fitting portion 11. The second portion 142 is inserted into a through-hole formed through the printed circuit board 20 to thereby make electrical contact with the printed circuit board 20. The third portion 143 is embedded in the body 12 to thereby allow the first and second portions 141 and 142 to be supported by the body 12.

As illustrated in FIGS. 8 to 10, the male connector terminals 14 are grouped into a first group of male connector terminals for the first fitting portion 111, and a second group of male connector terminals for the second fitting portion 112. The first group includes the male connector terminals 14 in two rows and three rows located at a rear of the two rows. Each of the male connector terminals 14 in the two rows is designed to have a cross-sectional area larger than that of the male connector terminal 14 in the three rows. The second group includes the male connector terminals 14 in a matrix, each having a cross-sectional area substantially equal to the same of the male connector terminals 14 in the two rows in the first group.

Figure 1:
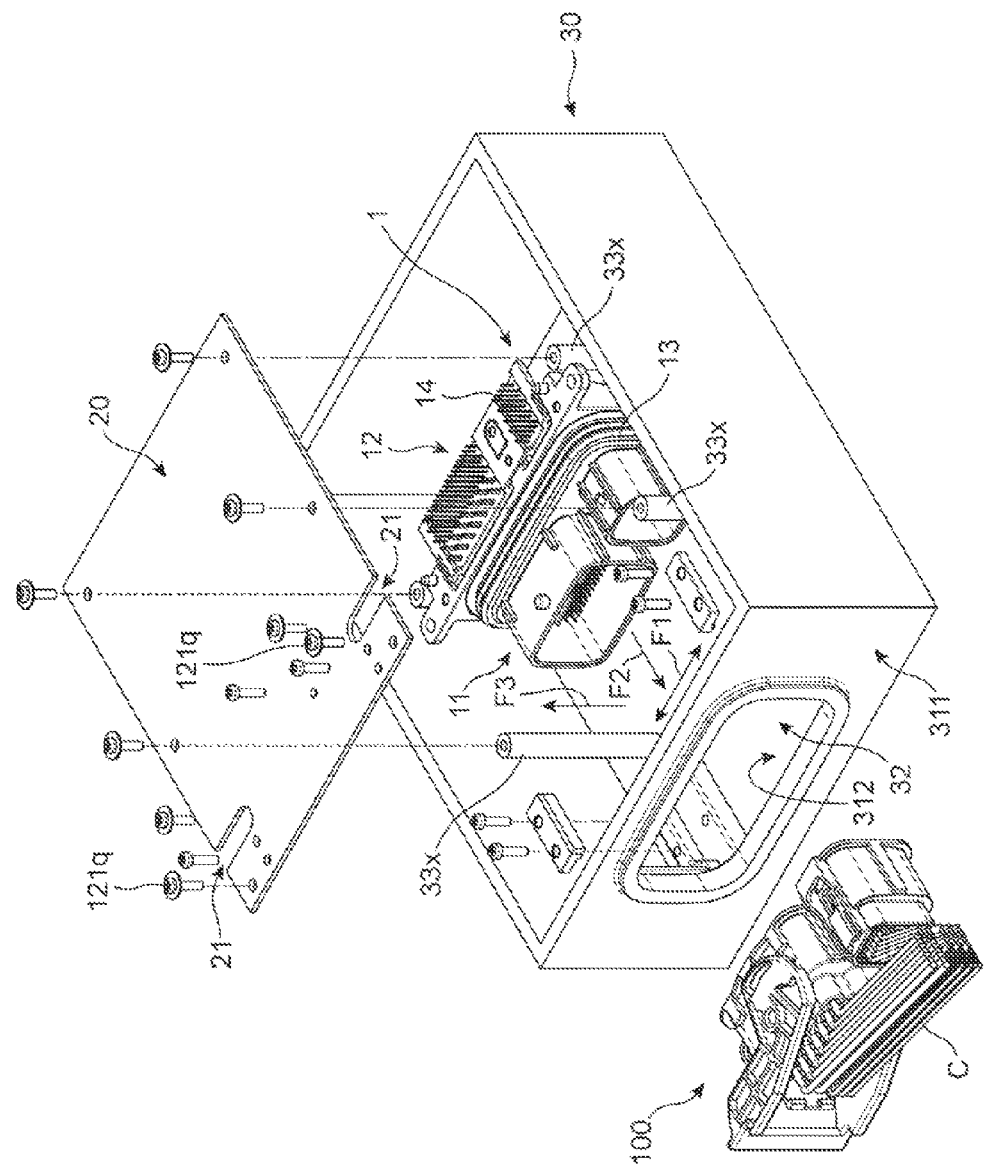
FIG. 1 is an exploded perspective view illustrating the casing in accordance with the preferred embodiment of the present invention, as well as a printed circuit board on which an electric connector is mounted, and a second electric connector to which the electric connector is connected.

As illustrated in FIG. 1, the printed circuit board 20 is almost rectangular, and is fixed to the casing 30 by means of screws such that there is a space in which the electric connector 1 is housed. The printed circuit board 20 is formed with a pair of cut-outs 21 through which a driver (not illustrated) is inserted into the casing 30 for screwing the electric connector 1 to the casing 30.

Figure 2:
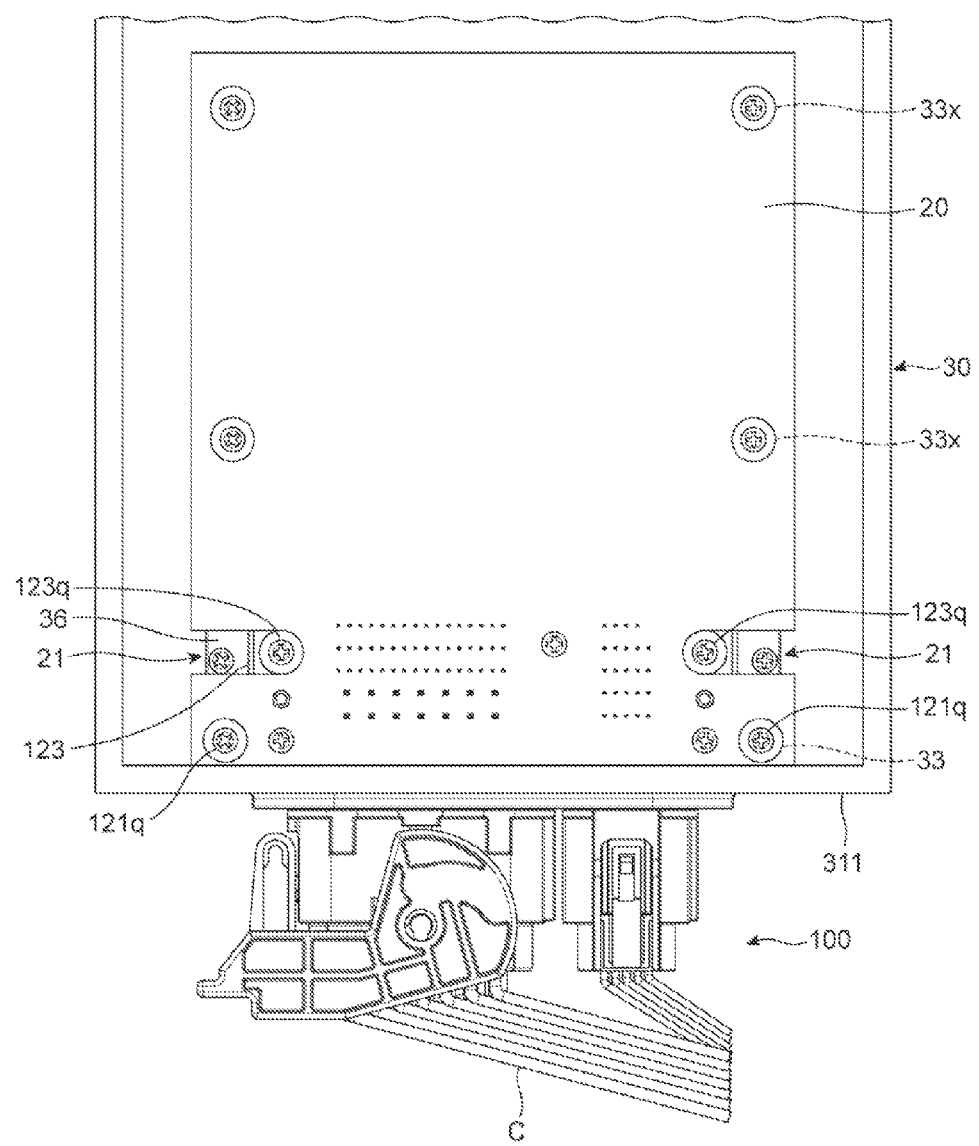
FIG. 2 is a plan view of the casing in which the electric connector mounted on the printed circuit board and connected to the second electric connector is housed.
Figure 5:
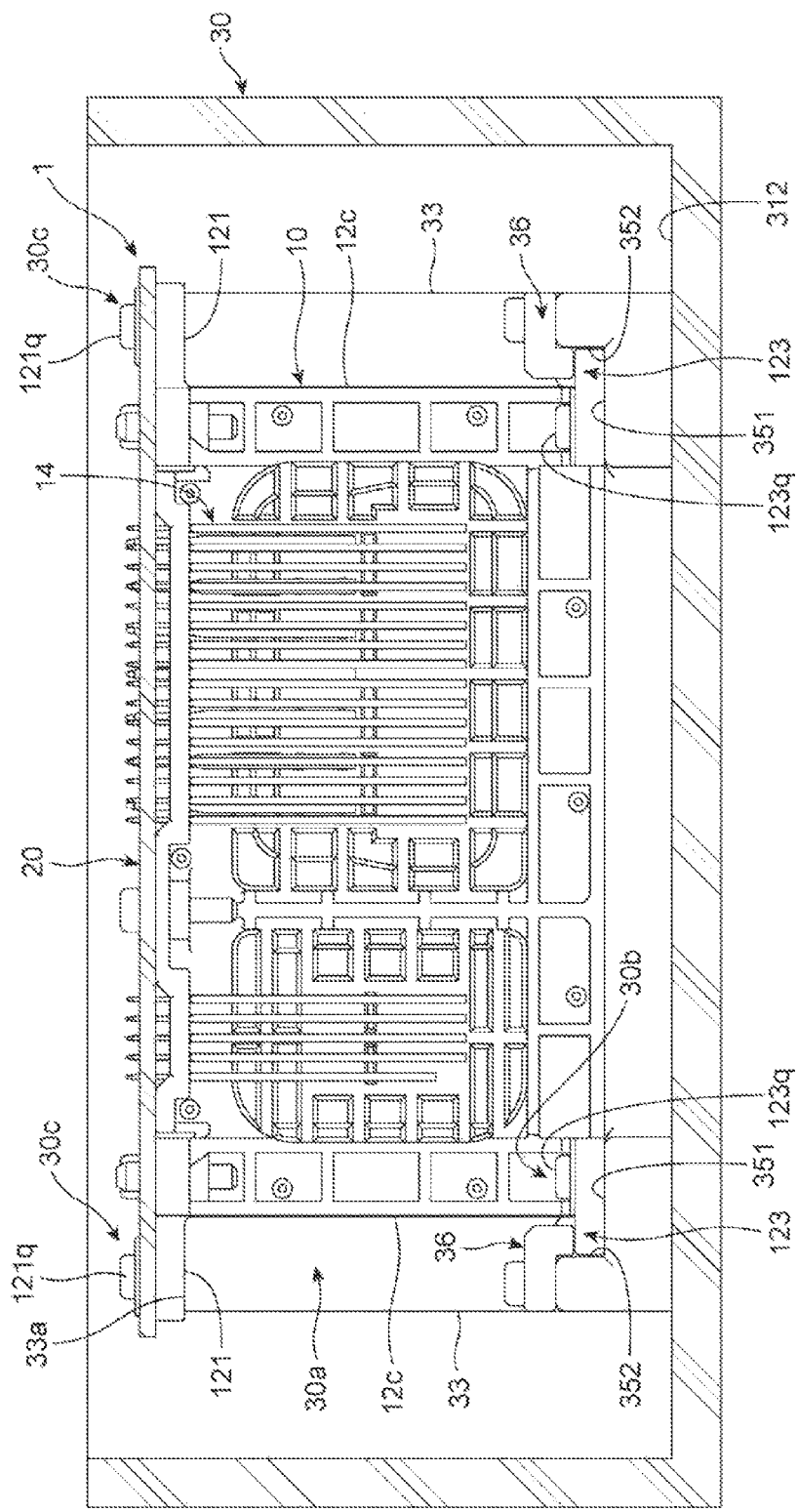
FIG. 5 is a rear view of the casing in which the electric connector is housed.

As illustrated in FIG. 5, the casing 30 is an aluminum die-cast product, and is in the form of a rectangular parallelepiped box. As mentioned above, the casing 30 is formed at the front wall 311 with the rounded cornered rectangular opening 32 through which the fitting portion 11 of the electric connector 1 projects outwardly of the casing 30. As illustrated in FIG. 2, the casing 30 includes a pair of first pillars 33 and four second pillars 33x to all of which the printed circuit board 20 is screwed.

Figure 12:
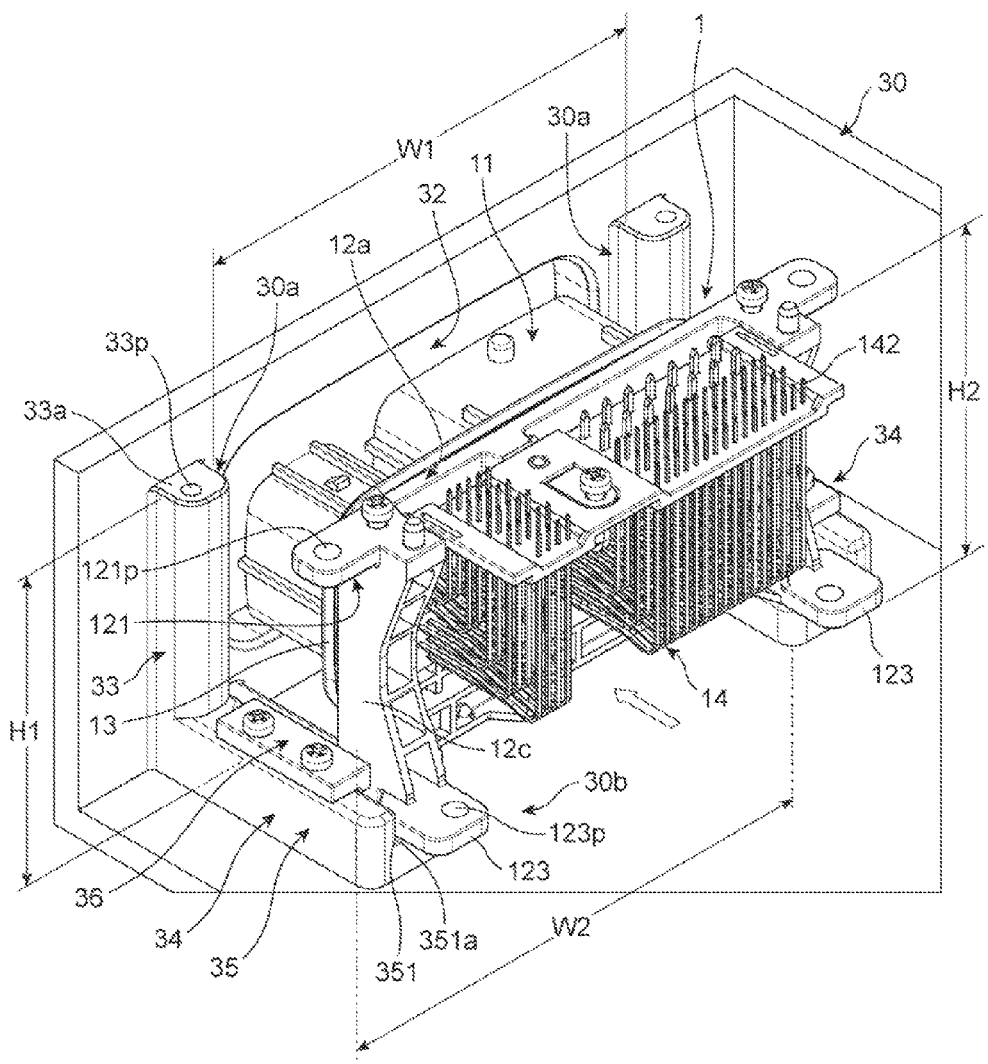
FIG. 12 is a rear upper perspective view of the electric connector housed in the casing.

As illustrated in FIGS. 4 and 12, the first pillars 33 are formed integral with the front wall 311 so as to sandwich the opening 32 therebetween in the direction F1. The first pillars 33 act as a first positioning unit 30a for positioning the electric connector 1 relative to the opening 32 in the direction F1. Specifically, a space W1 (see FIG. 12) between the first pillars 33 is set in accordance with a width W2 (see FIG. 12) of the body 12, and the first pillars 33 are positioned in accordance with a length of the opening 32 in the direction F1. Thus, the fitting portion 11 of the electric connector 1 can be fit into the opening 32 by positioning the body 12 in the direction F1 between the first pillars 33 acting as the first positioning unit 30a.

As illustrated in FIG. 2, the first pillars 33 are located in alignment with front corners of the printed circuit board 20. As illustrated in FIG. 4, each of the first pillars 33 is formed at a top surface 33a thereof with a threaded hole 33p.

Figure 3:
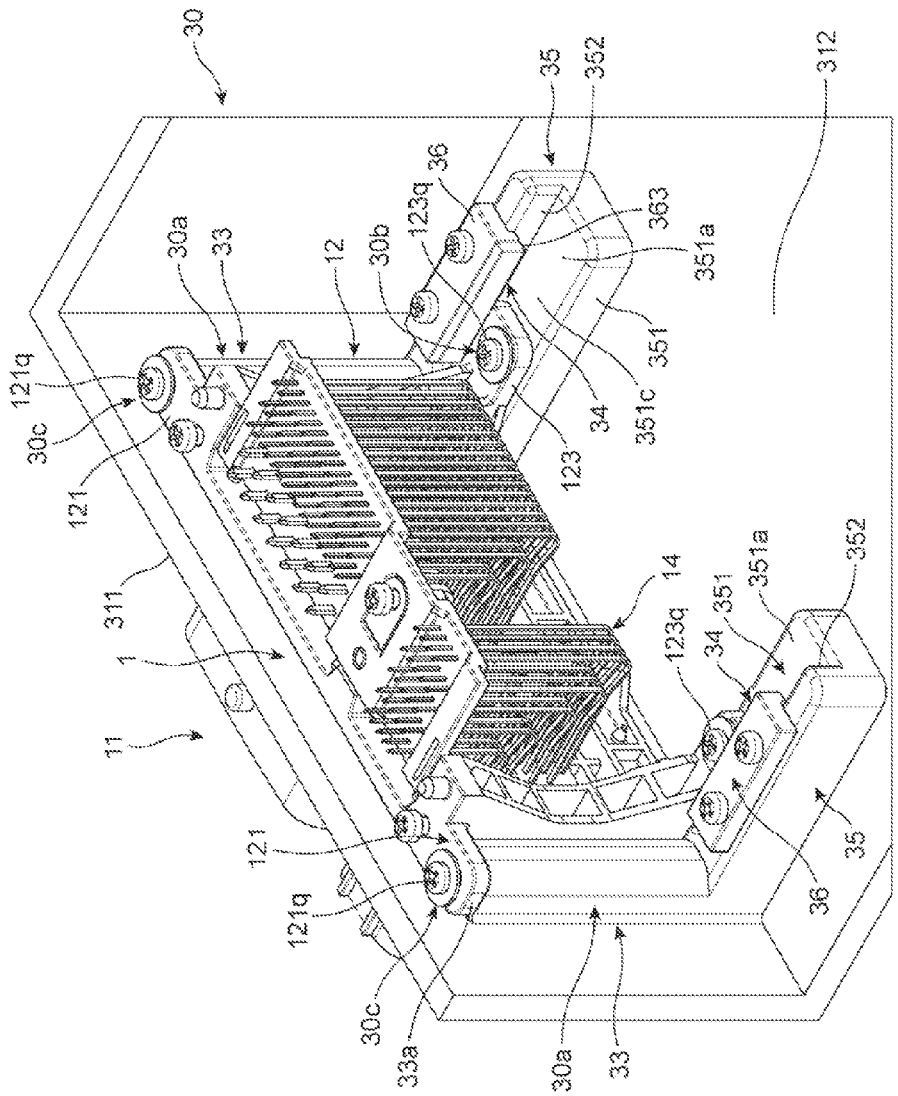
FIG. 3 is a partial rear perspective view of the casing in which the electric connector is housed.

As illustrated in FIGS. 3 to 5, the electric connector 1 and the printed circuit board 20 are fixed to the casing 30 by aligning the fixing holes 121p (see FIGS. 8 and 9) of the top plate 12a with the threaded holes 33p, and further aligning the through-holes (see FIGS. 1 and 2) of the printed circuit board 20 with the threaded holes 33p, and then, screwing the top plate 12a (accordingly, the body 12) and the printed circuit board 20 by means of screws 121q. As illustrated in FIG. 12, each of the first pillars 33 is designed to have a height H1 measured from a later-mentioned base surface 351 to the top surface 33a. Herein, the height H1 is set equal to such a height that the seal 13 (see FIGS. 1 and 8) is just aligned with the opening 32 in a height-wise direction F3 (see FIGS. 1 and 12) of the front wall 311 of the casing 30. Thus, the first pillars 33, in particular, the top surfaces 33a act as a second unit 30c (see FIG. 3) which is a part of a second positioning unit for positioning the electric connector 1 relative to the opening 32 in the direction F3.

The above-mentioned height H1 is set equal to a height H2 measured from a lower surface of the extensions 123 through which the extensions 123 make contact with the base surfaces 31, to a lower surface of the extensions 121 and accordingly the top plate 12a.

The printed circuit board 20 is fixed to the casing 30 further by being screwed to the second pillars 33x illustrated in FIGS. 1 and 2. The printed circuit board 20 is fixed to the second pillars 33x at center and rear corners at opposite edges situated in the direction F1 (see FIG. 2).

As illustrated in FIGS. 3 to 6, a pair of L-shaped first blocks 35 for positioning the electric connector 1 is formed on the floor 312 of the casing 30. The first blocks 35 are situated outwardly of the opening 32 in the direction F1. The first blocks 35 are integral at a front thereof with the first pillars 33.

As mentioned below in detail, the casing 30 includes a pair of guide paths 34 (see FIG. 6) allowing the electric connector 1 at the extensions 123 to slide towards the opening 32 from inside of the casing 30, ensuring that the fitting portion 11 can be inserted into the opening 32 without deviation in the directions F1 and F3.

Figure 6:
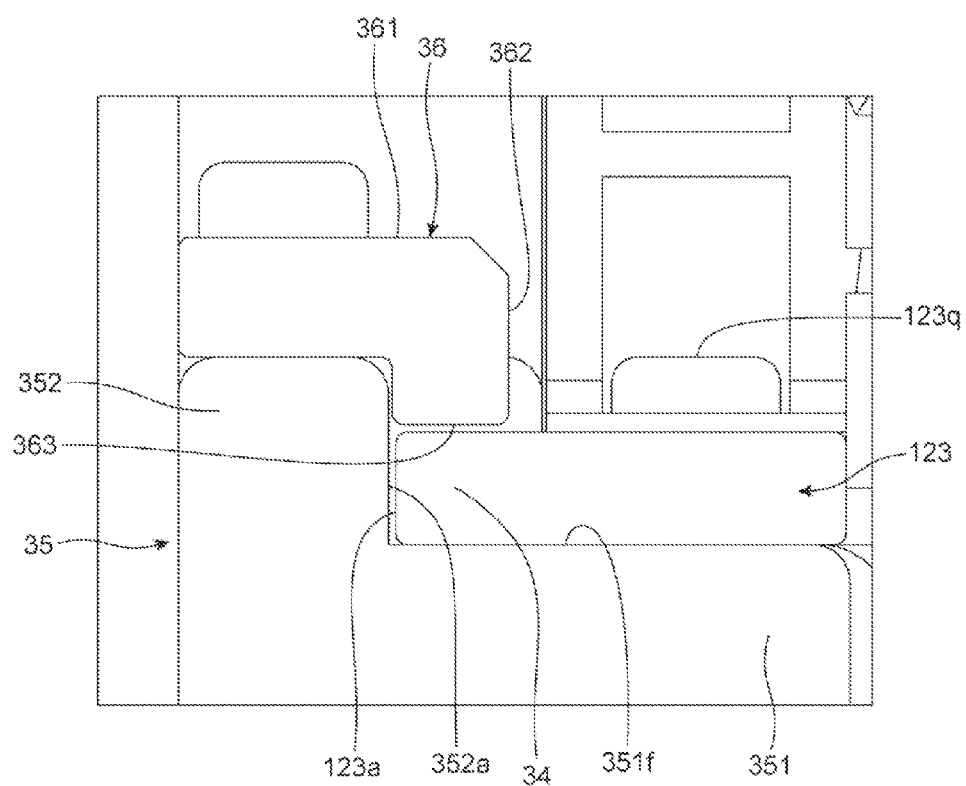
FIG. 6 is a partially enlarged view of FIG. 5.

As illustrated in FIG. 6, each of the guide paths 34 is defined by a first surface 351f with which the extensions 123 of the electric connector 1 make contact at a lower surface thereof, a second surface 363 situated above and in parallel with the first surface 351f, and a third surface 352a standing perpendicularly to the first surface 351f.

The first surface 351f is provided by a first part 351 of the first block 35, and the third surface 352a is provided by a second part 352 of the first block 35. A distance in the direction F3 between the first surface 351f and the second surface 363 is designed to allow the extension 123 of the electric connector 1 to slide therebetween. A distance in the direction F1 between the third surfaces 352a is designed to allow the extensions 123 to slide therebetween. The first surfaces 351f are designed to have such a height relative to the floor 312 that the seal 13 aligns with the opening 32 in the direction F3.

As illustrated in FIG. 4, each of the first blocks 35 is formed at the first surfaces 351f with a threaded hole 351p. The electric connector 1 is fixed to the casing 30 by putting the extensions 123 on the first surfaces 351f such that the fixing holes 123p of the extensions 123 align with the threaded holes 351p, and screwing the extensions 123 to the first blocks 35 by means of the screws 123q (see FIG. 3). When the electric connector 1 is fixed to the block 1, the seal 13 aligns with the opening 32 in the direction F3. Thus, the first surfaces 351f act as a first unit 30b which is a part of the above-mentioned second positioning unit.

As illustrated in FIG. 6, the casing 30 further includes a pair of L-shaped second blocks 36. Each of the second blocks 36 comprises a first portion 361, and a second portion 362 extending from the first portion 361. The first portion 361 in each of the second blocks 36 is screwed to a top surface of the second part 352 of the first block 35 such that the second portion 362 projects beyond the second part 352 inwardly of the casing 30 in the direction F1, enabling the second portion 362 to define the above-mentioned second surface 363.

As illustrated in FIGS. 3 and 4, the second blocks 36 and accordingly the second surfaces 363 are designed to have a length smaller than a length of the first surface 351f in the direction F2. Furthermore, the second surfaces 363 extend towards the opening 32 from a location away in the direction F2 from an end of the first surface 351f located remoter than the other end thereof from the opening 32 in the second direction F2. Specifically, as illustrated in FIG. 4, each of the second surfaces 363 is extensive only above a central area 351c of the first surface 351f, and not extensive above a rear area 351a and a front area 351b of the first surface 351f. Namely, the rear area 351a and the front area 351b of the first surface 351f are exposed.

Each of the second blocks 36 is designed to have such a width (a length in the direction F1) that the threaded hole 351p is exposed (namely, not covered by the second block 36) so that a driver can be inserted through the cut-out 21 (see FIG. 2) of the printed circuit board 20 to screw the extension 123 to the first surface 351f.

As illustrated in FIGS. 5 and 6, a distance between the first surface 351f and the second surface 363 is designed to be slightly greater than a thickness of the extension 123 to allow the extension 123 to slide in the guide path 34.

As illustrated in FIGS. 3 and 4, a distance between the third surfaces 352a in the direction F1 is defined in accordance with a distance between the sidewalls 123a of the extensions 123. Specifically, a distance between the third surfaces 352a in the direction F1 is defined to allow the extensions 123 to slide within the guide paths 34, as mentioned earlier.

Each of the third surfaces 352a includes a tapered portion 37 (see FIG. 4) causing a distance between the third surfaces 352a to be smaller at a location closer to the opening 32 from inside of the casing 30. Each of the third surfaces 352a is continuous to the first pillar 33 through the tapered portion 37, as illustrated in FIG. 4.

Hereinbelow is explained a process of setting the electric connector 1 into the casing 30.

First, as illustrated in FIG. 11A, the printed circuit board 20 on which the electric connector 1 is mounted is brought above the casing 30 such that the electric connector 1 faces the casing 30. Then, the extensions 123 of the electric connector 1 are positioned above the rear areas 351a of the first surfaces 351f.

Then, as illustrated in FIGS. 11B and 12, the extensions 123 of the electric connector 1 are put on the rear areas 351a.

If the second blocks 36 had such a length in the direction F2 that the second surfaces 363 cover the rear areas 351a, since the second blocks 36 interfere with the extensions 123, it is burdensome to put the extensions 123 on the rear areas 351a of the first surfaces 351f. However, the rear areas 351a are not covered by the second surfaces 363, namely, are exposed to an inner space of the casing 30, and the extensions 123 can be readily put on the rear areas 351a of the first surfaces 351f. Thus, the body 12 is now in a condition to be slidable towards the opening 32 in the direction F2.

Then, the body 12 is made to slide towards the opening 32 on the first surfaces 351f, namely, along the guide paths 34.

As illustrated in FIG. 6, since the extensions 123 of the electric connector 1 slide along the guide paths 34 defined by the first surface 351f, the second surface 363 and the third surface 352a, the body 12 can reach the opening 32 without being floated above the first surfaces 351f. Accordingly, it is possible to prevent the body 12 from inclining in the direction F3, specifically, prevent the fitting portion 11 from obliquely upwardly (or downwardly) inclining relative to the opening 32 in the direction F3.

Furthermore, since the extensions 123 are guided by the third surfaces 352a while sliding along the guide paths 34, it is possible to prevent the body 12 from inclining relative to the opening 32 in the direction F1.

As illustrated in FIGS. 4 and 9, the extensions 123 slide along the guide paths 34 through the rear areas 351a, the central areas 351c and the front areas 351b in this order. When the front walls 123b of the extensions 123 arrive at the front areas 351b, the front walls 123b make abutment with the tapered portions 37, and thus, the extensions 123 are guided along the tapered portions 37. Accordingly, it is possible to direct the body 12 in the direction F2 accurately to the opening 32 situated between the first pillars 33 merely by causing the body 12 to slide along the guide paths 34.

Figure 11C:
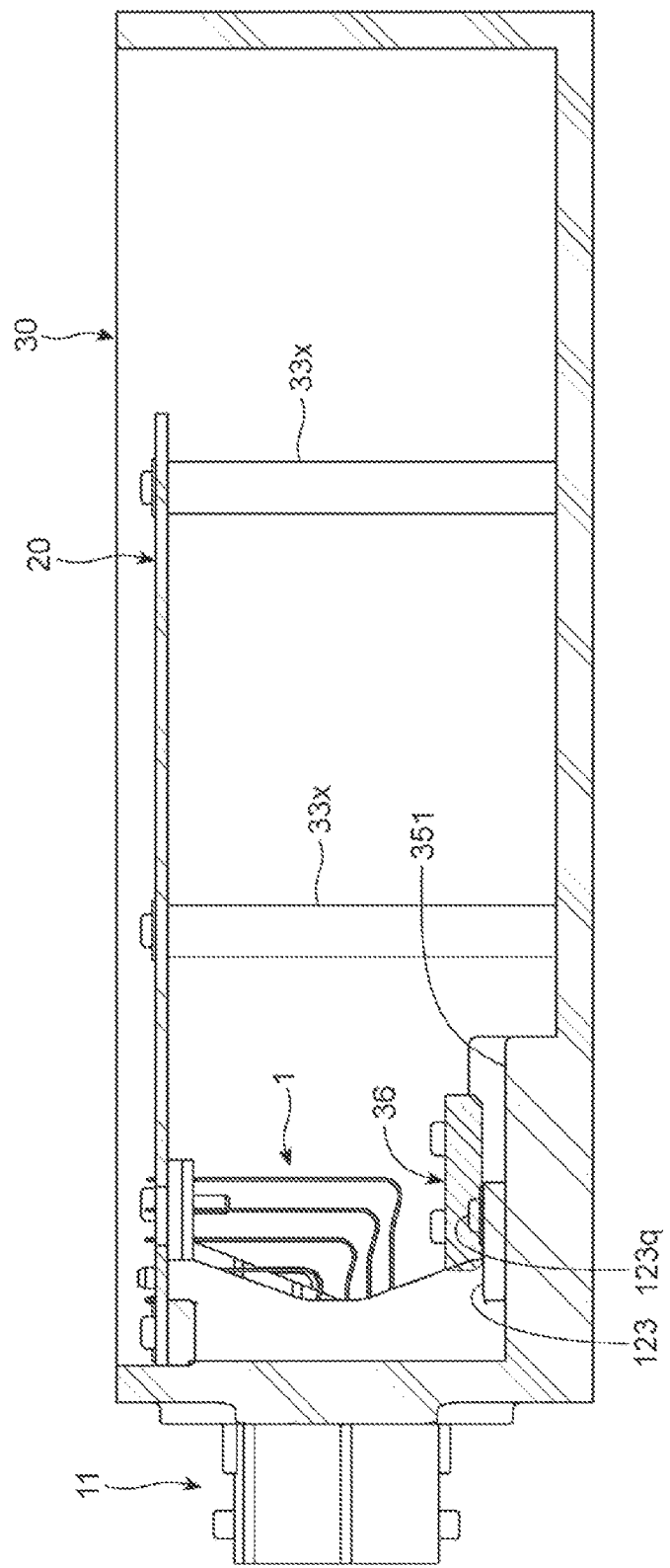
FIG. 11C is a cross-sectional view showing a third step of housing the electric connector in the casing.

Then, as illustrated in FIGS. 3 and 11C, the electric connector 1 slides along the guide paths 34 until making contact with the front wall 311, and thus, the fitting portion 11 of the electric connector 1 projects outwardly of the casing 30 through the opening 32. In this situation, as illustrated in FIG. 3, the body 12 is sandwiched between the first pillars 33 with the side structures 12c making contact with inner (or facing) surfaces of the first pillars 33.

As illustrated in FIGS. 1 and 3, the body 12 can be positioned in the direction F1 by making contact with the first pillars 33 acting as the first positioning unit 30a. Furthermore, since the first pillars 33 acting as the first positioning unit 30a are spaced away from each other by a distance W1 defined in accordance with the width W2 of the body 12, the body 12 can be sandwiched between the first pillars 33 with the side structures 12c of the body 12 making contact with the first pillars 33, ensuring that the body 12 cannot be moved in the direction F1. Thus, the body 12 sandwiched between the first pillars 33 allows the seal 13 to accurately align with the inner edge 32a of the opening 32 in the direction F1.

As illustrated in FIGS. 4 and 12, when the fitting portion 11 is fit into the opening 32, the fixing holes 123p of the extensions 123 align with the threaded holes 351p of the first surfaces 351f, and the fixing holes 121p of the top plate 12a align with the threaded holes 33p of the first pillars 33.

As mentioned above, the first pillars 33 act as the first positioning unit 30a for positioning the electric connector 1 relative to the opening 32 in the direction F1, and hence, the electric connector 1 can be positioned in the direction F1 merely by being inserted between the first pillars 33.

Furthermore, the electric connector 1 can be positioned in the direction F3 by putting the extensions 123 on the first surfaces 351f and/or mounting the extensions 121 on the top surface 33a of the first pillars 33.

Then, the electric connector 1 is fixed to the casing 30 by means of the screws 123q (see FIG. 3) inserted into the threaded holes 351p through the fixing holes 123p, and further by the screws 121q (see FIG. 3) inserted into the threaded holes 33a through the fixing holes 121p of the extensions 121. The printed circuit board 20 on which the electric connector 1 is mounted is fixed to the casing 30 by screwing the printed circuit board to the second pillars 33x.

Since the body 12 is fixed to the first surfaces 351f through the extensions 123 by means of the screws 123q (see FIG. 3), it is possible to prevent the body 12 from moving and/or inclining in the direction F3. Furthermore, since the top plate 12a is fixed to the first pillars 33 by means of the screws 121q (see FIG. 3), it is further possible to prevent the body 12 from moving and/or inclining in the direction F3.

As mentioned above, the body 12 of the electric connector 1 is positioned in the direction F1 by means of the first positioning unit 30a, and further positioned in the direction F3 by means of the second positioning unit including the first unit 30b and the second unit 30c. Thus, the seal 13 arranged around the fitting portion 11 can be aligned with the inner edge 32a of the opening 32 in the directions F1 and F3.

Since the body 12 of the electric connector 1 can be positioned relative to the opening 32 in the directions F1 and F3, it is possible to prevent the electric connector 1 from deviating in position from the opening 32 of the casing 30. Consequently, the casing 30 in accordance with the preferred embodiment of the present invention enables the seal 13 to make uniform and close contact with the inner edge 32a of the opening 32.

In the current embodiment, the first pillars 33 are designed to act as the first positioning unit 30a for positioning the electric connector 1 relative to the opening 32 in the direction F1. Since the first pillars 33 are designed to stand to sandwich the opening 32 therebetween, it is not necessary to prepare a particular space to be occupied by the first positioning unit 30a.

The top surfaces 33a of the first pillars 33 act as the second unit 30c (see FIG. 3) which is a part of the second positioning unit for positioning the electric connector 1 relative to the opening 32 in the direction F3. Thus, the first pillars 33 act not only as the first positioning unit 30a for positioning the electric connector 1 relative to the opening 32 in the direction F1, but also as the second positioning unit for positioning the electric connector 1 relative to the opening 32 in the direction F3. Hence, it is not necessary to prepare a particular space to be occupied by the second unit 30c, ensuring that a space in the casing 30 can be saved.

In addition, since the casing 30 is designed to include the guide paths 34 for guiding the fitting portion 11 of the electric connector 1 to the opening 32, it is possible to prevent the body 12 from inclining relative to the direction F2 while the body 12 is sliding along the guide paths 34. Thus, the fitting portion 11 can forward straightly towards the opening 32, and hence, the seal 13 arranged around the fitting portion 11 can make uniform contact with the inner edge 32a of the opening 32, and be uniformly compressed. This ensures that the electric connector 1 can be connected to the casing 30 without damaging the seal 13.

As illustrated in FIG. 3, the casing 30 in accordance with the present embodiment is designed to include the first unit 30b and the second unit 30c for fixing the electric connector 1 to the casing 30. It should be noted that the casing 30 may be designed to include one of the first unit 30b and the second unit 30c. It is preferable for the casing 30 to include both the first and second units 30b and 30c, because the first and second units 30b and 30c position the electric connector 1 relative to the opening 32 in the direction F3, and further, provide an enhanced resistance to the top plate 12a and the bottom 12b of the electric connector 1 against a compression force exerted on them when the electric connector 1 is coupled to the second electric connector 100 (see FIG. 1).

As illustrated in FIGS. 3 and 6, the first surfaces 351f and the second surfaces 363 are defined by the first blocks 35, and the third surfaces 352 are defined by the second blocks 36.

For instance, it is supposed that the casing 30 illustrated in FIG. 1 is made by the aluminum die-casting process. If a die used for die-casting the casing 30 is upwardly open to the atmosphere, that is, the die is open in the direction F3, since the spaces defined by the first surfaces 351f, the second surfaces 363 and the third surfaces 352 as the guide paths 34 extend in the direction F1 perpendicular to the direction F3, it is difficult to integrally form the first and second blocks 35 and 36 on the floor 312 of the casing 30.

Thus, it is possible to design the casing 30 to include the guide paths 34 by forming the second blocks 36 separately from the first blocks 35, and screwing the second blocks 36 to the first blocks 35. Accordingly, the casing 30 can be designed to include the guide paths 34 regardless of which direction a die is open, and thus, other parts in the casing 30 can be readily formed.

The first positioning unit may be designed to include a single first pillar 33 situated outwardly of the opening 32 in the direction F1, in which case, the first pillar 33 is located such that, when the electric connector 1 is arranged in contact with the first pillar 33, the fitting portion 11 of the electric connector 1 is located in alignment with the opening 32.

INDUSTRIAL APPLICABILITY

The casing in accordance with the present invention is preferably used for an electric connector having waterproofness in the case that an electric circuit necessary to prevent water penetration thereinto is housed in the casing. In particular, the casing in accordance with the present invention is suitable to an electric connector to be equipped in an automobile running in drastically changed environments.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 2013-264075 and 2013-264180 both filed on Dec. 20, 2013 and of Japanese Patent Application No. 2014-004432 filed on Jan. 14, 2014 including specification, claims, drawings and summary is incorporated herein by reference in its entirety.

What is claimed is:

1. A casing in which an electric connector is housed, including:
   a floor; and
   at least one wall standing perpendicularly to said floor, wherein said wall is formed with an opening,
   when a part of said electric connector projects outwardly through said opening, a seal formed around said part makes close contact with an inner edge of said opening, said casing further including:
- a first positioning unit for positioning said electric connector relative to said opening in a first direction defined as a length-wise direction of said wall; and
- a second positioning unit for positioning said electric connector relative to said opening in a height-wise direction of said wall.

2. The casing as set forth in claim 1, wherein said first positioning unit includes a single pillar situated outwardly of said opening in said first direction,
   said pillar being located such that when said electric connector is arranged in contact with said pillar, said part of said electric connector is located in alignment with said opening.

3. The casing as set forth in claim 1, wherein said first positioning unit includes a pair of pillars each situated outwardly of said opening in said first direction,
   a distance between said pillars being determined in accordance with a length of said electric connector in said first direction.

4. The casing as set forth in claim 1, wherein said second positioning unit includes a first unit having a first surface with which said electric connector makes contact at a lower surface thereof.

5. The casing as set forth in claim 4, wherein said second positioning unit includes a second unit having a second surface with which said electric connector makes contact at an upper surface thereof.

6. The casing as set forth in claim 5, wherein said second surface is located on a level with a top surface of said pillar, said second unit being mounted on said top surface of said pillar.

7. The casing as set forth in claim 1, further including a pair of guide paths allowing said electric connector at opposite ends thereof located in said first direction to slide towards said opening from inside of said casing on a first surface with which said electric connector makes contact at a lower surface thereof.

8. The casing as set forth in claim 7, wherein each of said guide paths includes:
   a first part having said first surface; and
   a second part having a third surface standing perpendicularly to said first surface,
   a distance between said third surfaces of said guide paths being in accordance with a length of said electric connector in said first direction.

9. The casing as set forth in claim 8, wherein each of said third surfaces includes a tapered portion causing a distance between said third surfaces to be smaller towards said opening from inside of said casing.

10. The casing as set forth in claim 8, wherein each of said guide paths further includes a third part having a second surface extending from said third surface in parallel with said first surface,
    a distance between said first and second surfaces being such a distance that said electric connector is fittable at said opposite ends thereof into a space formed between said first and second surfaces.

11. The casing as set forth in claim 10, wherein said third part is detachably attached to said second part.

12. The casing as set forth in claim 10, wherein a length of said second surface in a second direction perpendicular to said first direction is smaller than a length of said first surface in said second direction.

13. The casing as set forth in claim 12, wherein said second surface extends towards said opening from a location away in said second direction from an end of said first surface located remoter than the other end thereof from said opening in said second direction.

14. An electric connector to be housed in the casing defined in claim 3, including a pair of surfaces at opposite ends thereof located in said first direction, each of said surfaces making contact with an inner surface of each of said pillars.

15. An electric connector to be housed in the casing defined in claim 9, including a pair of extensions outwardly extending from opposite ends thereof located in said first direction,
    each of said extensions having a tapered portion causing a distance between said extensions to be smaller towards said opening from inside of said casing.

* * * * *